United States Patent
Kim et al.

(10) Patent No.: US 10,338,477 B2
(45) Date of Patent: Jul. 2, 2019

(54) LITHOGRAPHY APPARATUS

(71) Applicant: SAMSUNG ELECTRONICS CO., LTD., Suwon-si, Gyeonggi-do (KR)

(72) Inventors: Do Hyung Kim, Suwon-si (KR); Seong Sue Kim, Seoul (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/674,129

(22) Filed: Aug. 10, 2017

(65) Prior Publication Data
US 2018/0164694 A1    Jun. 14, 2018

(30) Foreign Application Priority Data
Dec. 12, 2016    (KR) .................... 10-2016-0168635

(51) Int. Cl.
*G03F 7/20* (2006.01)
*G03F 1/38* (2012.01)

(52) U.S. Cl.
CPC ............ *G03F 7/70166* (2013.01); *G03F 1/38* (2013.01); *G03F 7/2004* (2013.01); *G03F 7/2063* (2013.01); *G03F 7/70033* (2013.01); *G03F 7/70708* (2013.01); *G03F 7/70716* (2013.01); *G03F 7/70825* (2013.01); *G03F 7/70833* (2013.01); *G03F 7/70916* (2013.01)

(58) Field of Classification Search
CPC ............. G03F 7/70708; G03F 7/70916; G03F 7/70908; G03F 7/70925
See application file for complete search history.

(56) References Cited

U.S. PATENT DOCUMENTS

| | | | |
|---|---|---|---|
| 6,169,652 B1* | 1/2001 | Klebanoff | G03F 7/707 361/234 |
| 6,642,531 B1 | 11/2003 | Powers | |
| 6,734,443 B2 | 5/2004 | Zheng et al. | |
| 7,248,332 B2 | 7/2007 | Owen | |
| 7,875,864 B2 | 1/2011 | Sogard | |
| 8,724,088 B2 | 5/2014 | Lin et al. | |
| 9,244,368 B2 | 1/2016 | Delgado et al. | |
| 2005/0275835 A1 | 12/2005 | Sogard | |
| 2007/0285632 A1 | 12/2007 | Phillips et al. | |
| 2014/0253887 A1* | 9/2014 | Wu | G03F 1/82 355/30 |

FOREIGN PATENT DOCUMENTS

KR    10-0935763 B1    12/2009

* cited by examiner

*Primary Examiner* — Steven Whitesell Gordon
(74) *Attorney, Agent, or Firm* — Lee & Morse, P.C.

(57) ABSTRACT

A lithography apparatus is provided. The lithography apparatus a reticle having a first surface and a second surface facing each other, and a pattern region formed on the first surface, a reticle stage facing the second surface of the reticle, the reticle stage to chuck the reticle, a protection conductor within a chamber housing the reticle and the reticle stage; and a power source to supply a voltage to the protection conductor.

19 Claims, 20 Drawing Sheets

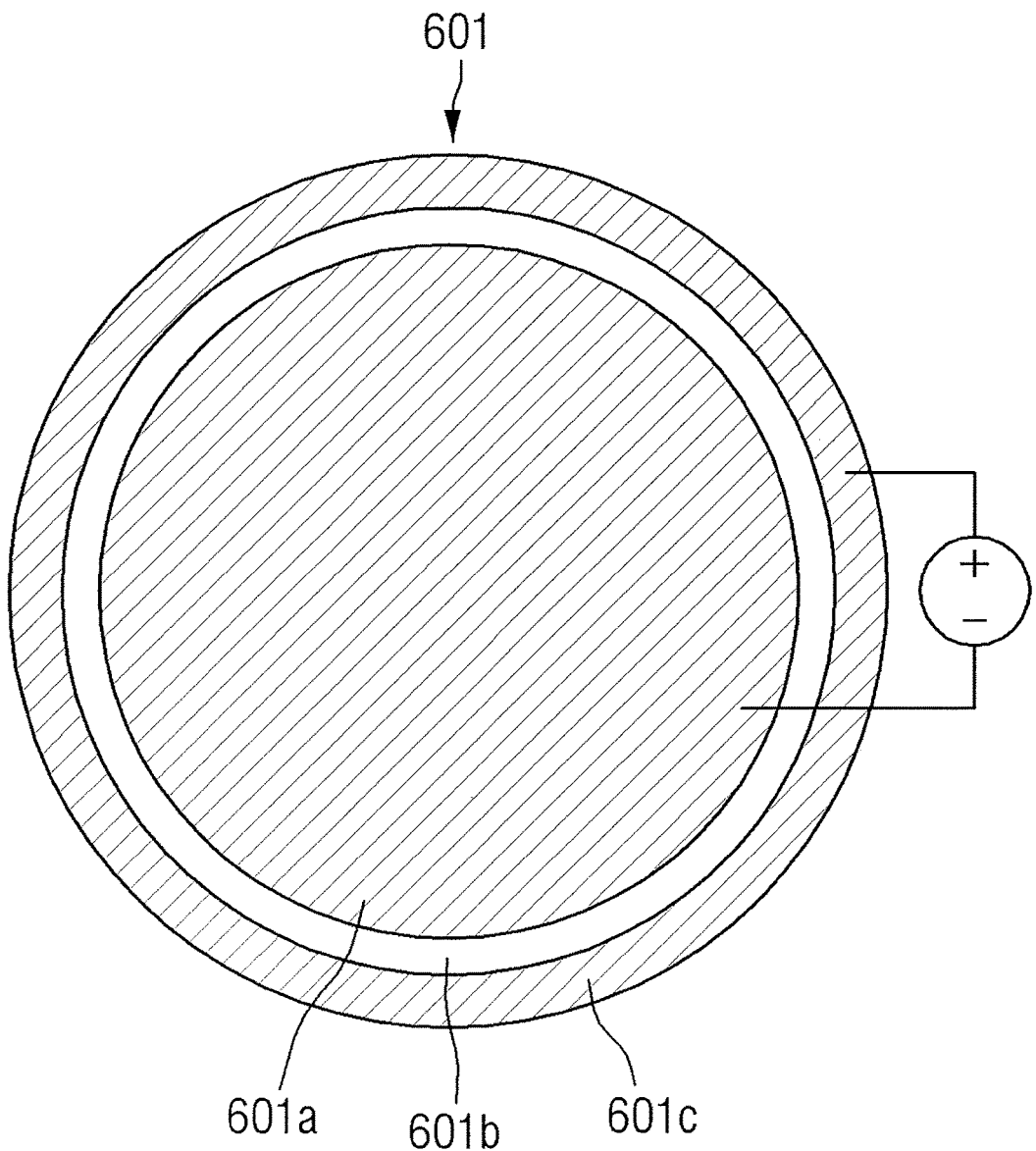

LITHOGRAPHY APPARATUS

CROSS-REFERENCE TO RELATED APPLICATION

Korean Patent Application No. 10-2016-0168635, filed on Dec. 12, 2016, in the Korean Intellectual Property Office, and entitled: "Lithography Apparatus," is incorporated by reference herein in its entirety.

BACKGROUND

1. Field

The present disclosure relates to a lithography apparatus, and more specifically, to a lithography apparatus using extreme ultraviolet (EUV) light.

2. Description of the Related Art

EUV lithography, which provides much finer pattern resolution than can be obtained by using an optical lithography, is a prominent candidate for the next-generation lithography. Using the EUV lithography increases resolution is due to the fact that the EUV lithography is performed using wavelengths within a 11 nm-15 nm range of wavelength, while the optical lithography is performed using wavelengths within a 150 nm-250 nm range. Generally, as a wavelength of light used in pattern image with the lithography decreases, the resultant resolution increases.

EUV light attenuates when traveling through air and no currently known material has the transmittance and refractivity for the EUV light suitable for being used as a EUV lens. As a result, the EUV lithography is performed under high vacuum using reflective optical mirrors to illuminate the EUV light onto a reticle and project the illuminated pattern from the reticle onto a substrate. Thus, the reticle used in the EUV lithography is a reflective reticle, rather than a transparent reticle used in the optical micro lithography.

A pellicle is used in the optical micro lithography to protect the reticle from particle pollution. The pellicle is a transparent thin film on a frame which covers a patterned surface of the reticle. However, in the EUV lithography, the pellicle may not be used with the reticle, as the pellicle absorbs the EUV light, resulting in substantially no EUV light remains to project the pattern image onto the substrate. Accordingly, the reticle of the EUV lithography should be used without a pellicle.

SUMMARY

In accordance with an aspect of the present disclosure, the lithography apparatus includes a reticle including a first surface and a second surface opposite each other, and a pattern region on the first surface, a reticle stage facing the second surface of the reticle and configured to chuck the reticle, and a power source to provide a negative voltage to the first surface of the reticle so as to prevent adsorption of particles onto the reticle.

In accordance with another aspect of the present disclosure, the lithography apparatus includes a reticle including a first surface and a second surface opposite each other, and a pattern region on the first surface, a reticle stage facing the second surface of the reticle and configured to chuck the reticle, and an electric field curtain arranged to adjust a moving direction of particles on the first surface of the reticle or on a periphery of the reticle, and including at least one or more conductors.

In accordance with still another aspect of the present disclosure, the lithography apparatus includes a first sub-chamber including at least one or more lighting system reflective mirrors disposed therein to reflect the exposure light, a reticle stage module including a reticle reflecting the exposure light output from the first sub-chamber, a second sub-chamber including at least one or more projection optical system reflective mirrors therein to project the reflected exposure light onto a wafer, and a wafer stage to which the wafer is chucked, wherein the reticle includes a first surface on which the exposure light is incident, and a pattern region on the first surface, and a negative voltage is applied to the first surface of the reticle so as to block adsorption of particles onto the reticle.

In accordance with still another aspect of the present disclosure, the lithography apparatus includes a source configured to provide an exposure light, a first sub-chamber including at least one or more lighting system reflective mirrors disposed therein to reflect the exposure light, a reticle stage module including a reticle to reflect the exposure light that passed through the reflective module, a second sub-chamber comprising at least one or more projection optical system reflective mirrors disposed therein to project the reflected exposure light onto a wafer, and a wafer stage to which the wafer is chucked, the wafer stage being in a main chamber including the first sub-chamber and the second sub-chamber, wherein at least one of the main chamber, the first sub-chamber, and the second sub-chamber includes a particle capture electrode, the particle capture electrode being applied with a positive voltage.

In accordance with yet another aspect of the present disclosure, a lithography apparatus may include a reticle having a first surface and a second surface opposite each other, and a pattern region formed on the first surface, a reticle stage facing the second surface of the reticle, the reticle stage to chuck the reticle, a protection conductor within a chamber housing the reticle and the reticle stage, and a power source to supply a voltage to the protection conductor.

BRIEF DESCRIPTION OF THE DRAWINGS

Features will become apparent to those of skill in the art by describing in detail exemplary embodiments with reference to the attached drawings in which:

FIGS. 16A and 16B illustrate views provided to explain a shape of a reflective mirror of a lithography apparatus according to some exemplary embodiments.

DETAILED DESCRIPTION

In the following description, a lithography apparatus relates to blocking a particle from approaching a surface of a reticle by using electric force. Further, the lithography apparatus which will be described below relates to capturing a particle within the lithography apparatus by using the electric force.

Although it is described that the lithography apparatus includes the reticle 210 chucked to a reticle stage 200, exemplary embodiments may not be limited hereto. That is, throughout the following explanation, a person skilled in the art will be able to distinguish the reticle from the lithography apparatus from which the reticle is removed.

Figure 1:
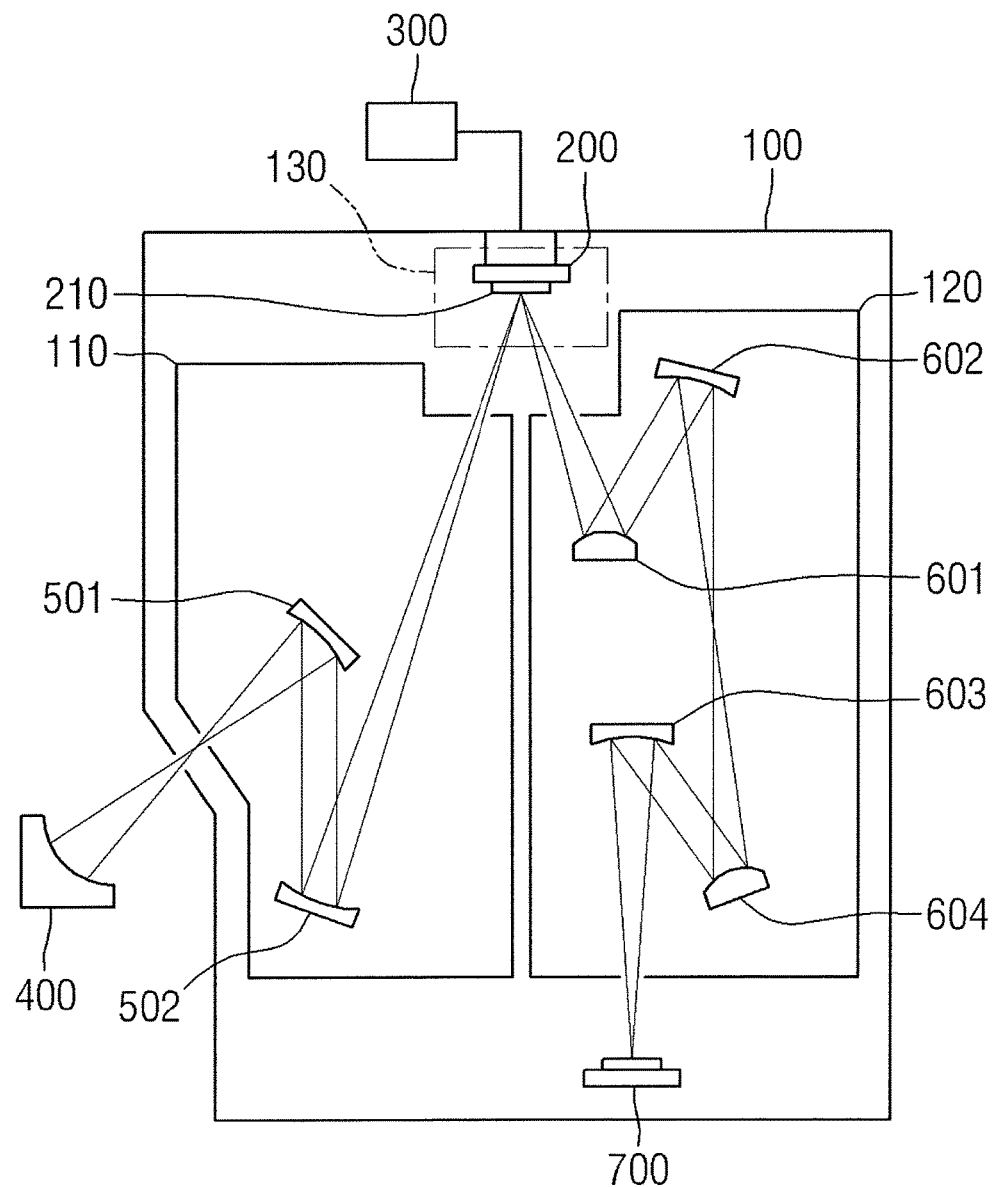
FIG. 1 illustrates a schematic view provided to explain a lithography apparatus according to some exemplary embodiments.
Figure 2:
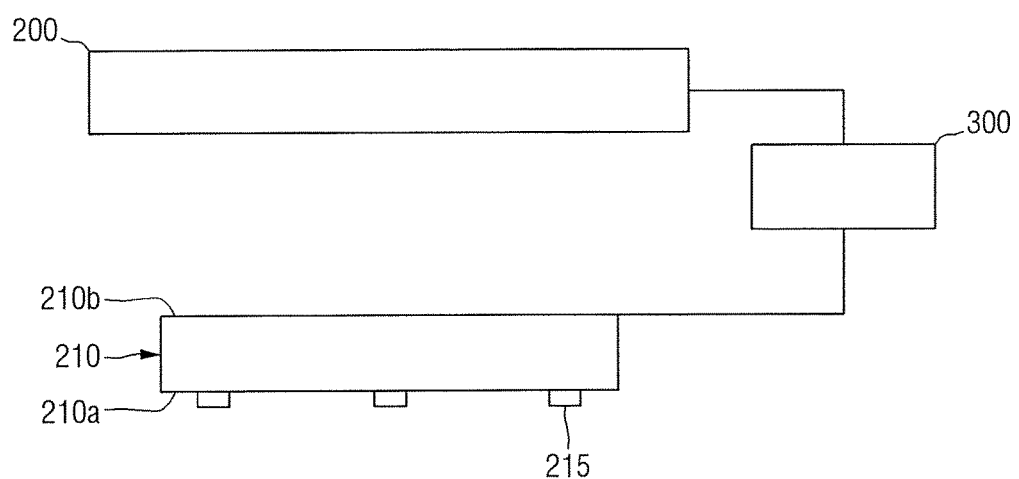
FIG. 2 illustrates a view provided to explain the reticle of FIG. 1 being chucked to a reticle stage.
Figure 3:
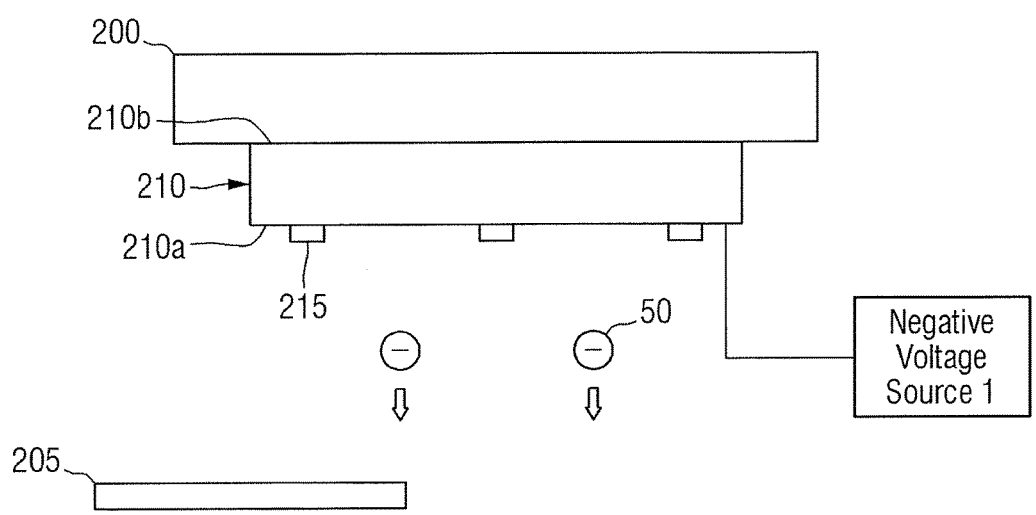
FIG. 3 illustrates a view provided to explain the reticle stage module of FIG. 1.
Figure 4A:
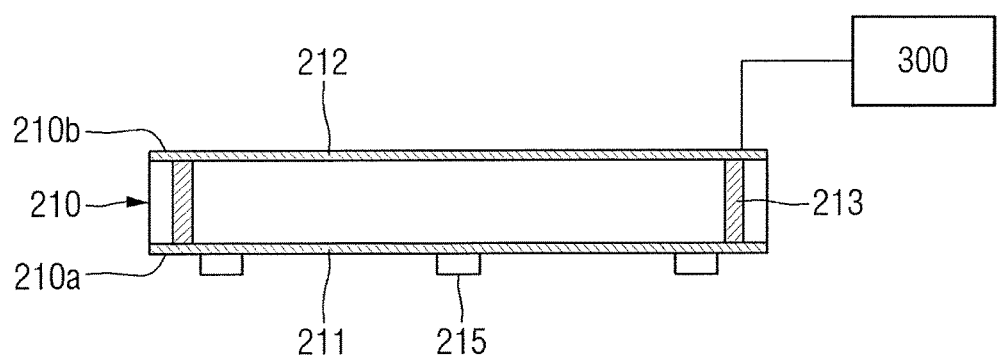
FIGS. 4A to 4C illustrate exemplary views provided to explain a shape of the reticle of FIG. 1.
Figure 4B:
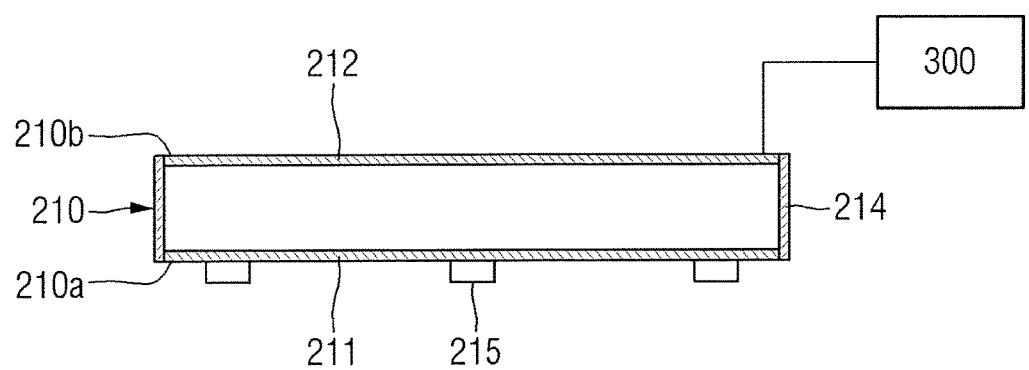
Figure 4C:
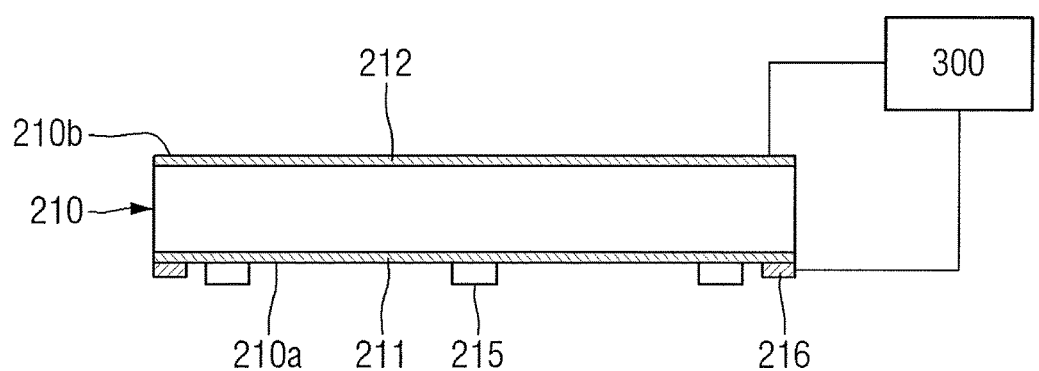

FIG. 1 is a schematic view provided to explain a lithography apparatus according to some exemplary embodiments. FIG. 2 is a view provided to explain that the reticle of FIG. 1 is chucked to a reticle stage. FIG. 3 is a view provided to explain the reticle stage module of FIG. 1. FIGS. 4A to 4C are views provided to explain a shape of the reticle of FIG. 1.

First, referring to FIGS. 1 to 4C, the lithography apparatus according to some exemplary embodiments may include a main chamber 100 and a source 400. The main chamber 100 may include a first sub-chamber 110, a second sub-chamber 120, a reticle stage module 130, a reticle stage power source 300, lighting system reflective mirrors 501, 502, projection optical system reflective mirrors 601, 602, 603, 604, and a wafer stage 700.

The first sub-chamber 110 may be positioned within the main chamber 100. At least one or more of the lighting system reflective mirrors 501, 502 may be disposed within the first sub-chamber 110.

Exposure light from the source 400 is incident on and reflected by the lighting system reflective mirrors 501, 502, and passes through the first sub-chamber 110 to be incident on the reticle 210 chucked to the reticle stage 200. In order to increase reflection efficiency of the exposure light, an internal region of the first sub-chamber 110 may be kept in a vacuum state.

The second sub-chamber 120 may be positioned within the main chamber 100. At least one or more of the projection optical system reflective mirrors 601, 602, 603, 604 may be disposed within the second sub-chamber 120.

The exposure light reflected from a surface of the reticle 210 may be incident on and reflected by the projection optical system reflective mirrors 601, 602, 603, 604, and emitted to a wafer on the wafer stage 700. In order to increase reflection efficiency of the exposure light, an internal region of the second sub-chamber 120 may be kept in a vacuum state. Thus, the reticle 210 may reflect the exposure light from the first sub-chamber 110 to the second sub-chamber 120.

The reticle stage module 130 may be positioned within the main chamber 100, in optical communication with the first sub-chamber 110 and the second sub-chamber 120. The reticle stage module 130 may include the reticle stage 200, the reticle 210, a reticle masking blade 205, and so on, as may be seen in FIG. 3.

The reticle stage 200 may be positioned on an upper portion of the main chamber 100, e.g., may be secured to an upper, inner surface of the main chamber 100. The reticle 210 may be chucked to the reticle stage 200. The reticle stage 200 may perform scanning.

In FIGS. 1 to 3, the reticle 210 may include a first surface 210a and a second surface 210b opposite each other. The reticle 210 may include a pattern region 215 formed on the first surface 210a of the reticle.

The exposure light output from the first sub-chamber 110 may be incident on the first surface 210a of the reticle where the pattern region 215 is formed. The pattern region 215 may include a material for absorbing the exposure light generated from the source 400. Accordingly, the exposure light remaining, e.g., not absorbed by the pattern region 215 among the exposure light entering the first surface 210a of the reticle 210, is reflected to the projection optical system reflective mirror 601 within the second sub-chamber 120.

As shown in FIG. 4A to 4C, the reticle 210 may include a first reticle conductive film 211 on the first surface 210a of the reticle and a second reticle conductive film 212 on the second surface 210b of the reticle. The first surface 210a of the reticle may be defined by the first reticle conductive film 211 and the second surface 210b of the reticle may be defined by the second reticle conductive film 212. For example, the first reticle conductive film 211 may include ruthenium (Ru) and the second reticle conductive film 212 may include chromium nitride (CrN), but not limited hereto.

As shown in FIG. 3, the reticle masking blade 205 may be positioned between the first and second sub-chambers 110, 120 and the reticle stage 200. The reticle masking blade 205 may be connected to an outer portion of the first sub-chamber 110 and/or the second sub-chamber 120, but not limited hereto. The reticle masking blade 205 may adjust dimension, and so on of the exposure light entering the first surface 210a of the reticle.

The reticle stage power source 300 may be electrically connected to the reticle 210 and the reticle stage 200. In FIG. 2, the reticle stage power source 300 may apply a first voltage to the reticle stage 200 and a second voltage having a different sign from that of the first voltage to the reticle 210.

As the reticle stage power source 300 is connected to the reticle stage 200 and the reticle 210, the electrostatic force may be generated between the reticle stage 200 and the reticle 210. That is, the reticle 210 may be chucked to the reticle stage 200 with the electrostatic force.

The second surface 210b of the reticle may be disposed to face the reticle stage 200. Next, by connecting the reticle stage power source 300 to the reticle stage 200 and the second surface 210b of the reticle, voltages having different signs or polarities from each other may be applied to the reticle stage 200 and the second surface 210b of the reticle. With the electrostatic force, the second surface 210b of the reticle may be chucked to the reticle stage 200.

For example, while a lithography process is performed, the reticle stage power source 300 may continuously provide a positive voltage to the reticle stage 200 and a negative voltage to the second surface 210b of the reticle. Conversely, the reticle stage power source 300 may continuously provide a negative voltage to the reticle stage 200 and a positive voltage to the second surface 210b of the reticle. That is, polarity of the voltage applied to the reticle stage 200 and polarity of the voltage applied to the second surface of the reticle 210 may be kept constant.

For another example, while the lithography process is performed, the reticle stage power source 300 may alternately provide a positive voltage and a negative voltage to the reticle stage 200, and alternately provide a negative voltage and a positive voltage to the second surface 210b of the reticle. That is, polarity of the voltage applied to the reticle stage 200 and polarity of the voltage applied to the second surface of the reticle 210 may change periodically.

The source 400 may be positioned externally from the main chamber 100. The source 400 may provide the exposure light for use in the lithography. The source 400 may emit the exposure light to the lighting system reflective mirrors 501, 502 within the first sub-chamber 110. The source 400 may be, for example, a discharging produced plasma (DPP) EUV light source, a laser produced plasma (LPP) EUV light source, a hybrid EUV light source, a synchrotron EUV light source, and so on, but not limited hereto.

The reflective mirrors 501, 502, 601, 602, 603, 604 may be positioned within the first sub-chamber 110 and the second sub-chamber 120. The reflective mirrors 501, 502, 601, 602, 603, 604 may be mirrors on which the exposure light emitted from the source 400 is incident at oblique angles and may have a multi-layered film as a reflective surface thereof.

In order to transfer a fine pattern onto the wafer, the projection optical system reflective mirrors 601, 602, 603, 604 may have high resolution. A number of the reflective mirrors 501, 502, 601, 602, 603, 604 may be, for example, six, but not limited hereto.

The wafer stage 700 may be positioned on a lower portion within the main chamber 100. A wafer may be chucked to the wafer stage 700. The wafer stage 700 may be movable for fine alignment. Further, the wafer stage 700 may move in a specific direction for the lithography process.

Referring to FIGS. 3 to 4C, a method for protecting the reticle 210 by blocking particles 50 from being adsorbed onto the surface of the reticle 210 will be described. In the lithography apparatus according to some exemplary embodiments, a negative voltage may be applied to the first surface 210a of the reticle where the pattern region 215 is formed. Particles may be blocked from being adsorbed onto the reticle 210 upon application of a negative voltage to the first surface 210a of the reticle.

For example, when a negative voltage is applied to the first reticle conductive film 211 formed on the first surface 210a of the reticle, the first surface 210a of the reticle may have a negative voltage. The first reticle conductive film 211 may be connected to a negative voltage source 1 that can provide a negative voltage.

The negative voltage source 1 may be the reticle stage power source 300 or another separate voltage source. Referring to FIGS. 4A to 4C, it is assumed that the negative voltage source 1 is the reticle stage power source 300.

In FIG. 4A, the reticle 210 may include a reticle via 213 which electrically connects the first reticle conductive film 211 and the second reticle conductive film 212. The reticle via 213 may be formed by extending through the reticle 210.

When the reticle stage power source 300 applies a negative voltage to the second reticle conductive film 212, the first reticle conductive film 211 connected to the second reticle conductive film 212 through the reticle via 213 may have a negative voltage. That is, a negative voltage may be applied to the first surface 210a of the reticle.

In FIG. 4B, the reticle 210 may include a sidewall conductive film 214 which electrically connects the first reticle conductive film 211 and the second reticle conductive film 212. The sidewall conductive film 214 may be formed along a sidewalls connecting the first surface 210a of the reticle and the second surface 210b of the reticle.

When the reticle stage power source 300 applies a negative voltage to the second reticle conductive film 212, the first reticle conductive film 211 connected to the second reticle conductive film 212 through the sidewall conductive film 214 may have a negative voltage. That is, a negative voltage may be applied to the first surface 210a of the reticle.

In FIG. 4C, the reticle 210 may include a connection pad 216 formed on a periphery of the pattern region 215. The connection pad 216 may be formed on a periphery of an edge of the reticle 210. The connection pad 216 may be formed on and electrically connected to the first reticle conductive film.

The reticle stage power source 300 may be connected to the connection pad 216 to apply a negative voltage to the first reticle conductive film 211. That is, a negative voltage may be applied to the first surface 210a of the reticle.

In FIGS. 4A and 4B, the first reticle conductive film 211 may be connected to the reticle stage power source 300 that provides a negative voltage through the second reticle conductive film 212. Meanwhile, in FIG. 4C, the first reticle conductive film 211 may be connected to the reticle stage power source 300 without passing by the second reticle conductive film 212.

While the lithography process is performed, when the reticle stage power source 300 continuously provides a negative voltage to the second reticle conductive film 212, the reticle exemplified in FIGS. 4A to 4C may be used.

Meanwhile, while the lithography process is performed, when the reticle stage power source 300 alternately provides a negative voltage and a positive voltage to the second reticle conductive film 212, the first surface 210a of the reticle explained in FIGS. 4A and 4B may be alternately applied with a negative voltage and a positive voltage.

Accordingly, when the reticle stage power source 300 alternately provides a negative voltage and a positive voltage to the second reticle conductive film 212, a shape, and so on, of the second reticle conductive film 212 may be adjusted so as to continuously apply a negative voltage to the first surface 210a of the reticle.

A voltage applied to the first surface 210a of the reticle described in FIG. 4C may be irrelevant to a voltage applied to the second surface 210b of the reticle. The first reticle conductive film 211 may be connected to the reticle stage power source 300 without passing through, e.g., without being electrically connected, the second reticle conductive film 212.

Next, charges of particles 50 present within the lithography apparatus will be explained below. Inside the source 400, there is a hydrogen flow to transfer the EUV light and prevent pollution of a collector. Further, a process of generating the EUV light may use plasma which is generated when a high power pulse laser hits tin (Sn) particles, for example.

Thus, it is highly likely that hydrogen inside the source 400 and the main chamber 100 may be present in an ionized state during the above process. As a result, a high quantity of electrons dissociated from hydrogen may be present inside the main chamber 100.

Accordingly, when electrons within the main chamber 100 are adhered onto the particles 50, the particles 50 may be negatively charged. It is also highly likely that the particles 50 on a periphery of the reticle 210 and on the first surface 210a of the reticle may also be negatively charged.

As a result, when a negative voltage is applied to the first surface 210a of the reticle, the repulsive force may apply between the particles 50 having negative charges on a periphery of the reticle 210 and on the first surface 210a of the reticle, and the reticle 210. Accordingly, the particles 50 having negative charges on a periphery of the reticle 210 and on the first surface 210a of the reticle may move in a direction of being farther away from the first surface 210a of the reticle. By blocking the particles 50 from being adsorbed onto the surface of the reticle 210, the surface of the reticle 210 from the particles 50 within the main chamber 100 may be protected.

Figure 5:
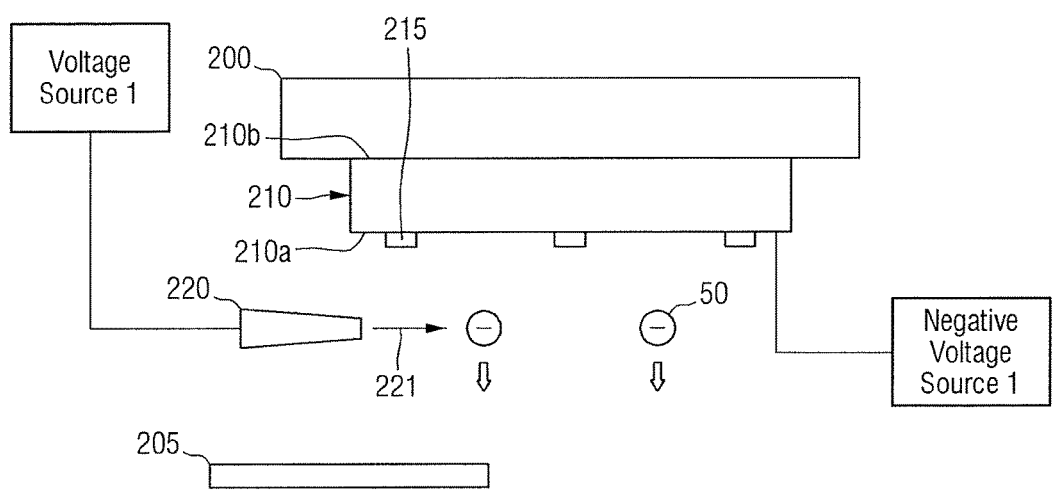
FIG. 5 illustrates a view provided to explain a reticle stage module of a lithography apparatus according to some exemplary embodiments.

FIG. 5 is a view provided to explain a reticle stage module of a lithography apparatus according to some exemplary embodiments. For convenience of explanation, differences between FIG. 5 and FIGS. 1 to 4C will be mainly explained below.

Referring to FIG. 5, in the lithography apparatus according to some exemplary embodiments, the reticle stage module 130 may further include an electron supply 220. The electron supply 220 may be arranged to supply the electrons 221 to the particles 50 on the first surface 210a of the reticle or on a periphery of the reticle 210.

The particles 50 within the main chamber 100 may have a mixture of negatively charged particles, neutral particles, and positively charged particles, under influence from the hydrogen plasma. In this case, the negatively charged particles may move in a direction of being farther away from the reticle 210 under influence from the electric force of the negative voltage applied to the first surface 210a of the reticle. However, the neutral particles or the positively charged particles may not move in a direction of being farther away from the reticle 210.

Accordingly, as the electrons 221 are provided by using the electron supply 220 to the particles 50 on the first surface 210a of the reticle or on a periphery of the reticle 210, the particles 50 on the first surface 210a of the reticle or on a periphery of the reticle 210 may be negatively charged. By using the electron supply 220, the negatively charged particles 50 on a periphery of the reticle 210 and the first surface 210a of the reticle may also move in a direction of being farther away from the first surface 210a of the reticle.

The electron supply 220 may be electrically connected to the voltage source 1. The voltage source 1 may be the reticle stage power source 300, or another separate voltage source.

Although FIG. 5 illustrates that the electron supply 220 is between the reticle stage 200 and the reticle masking blade 205, this is only for convenience of explanation, and exemplary embodiments are not limited hereto.

Figure 6:
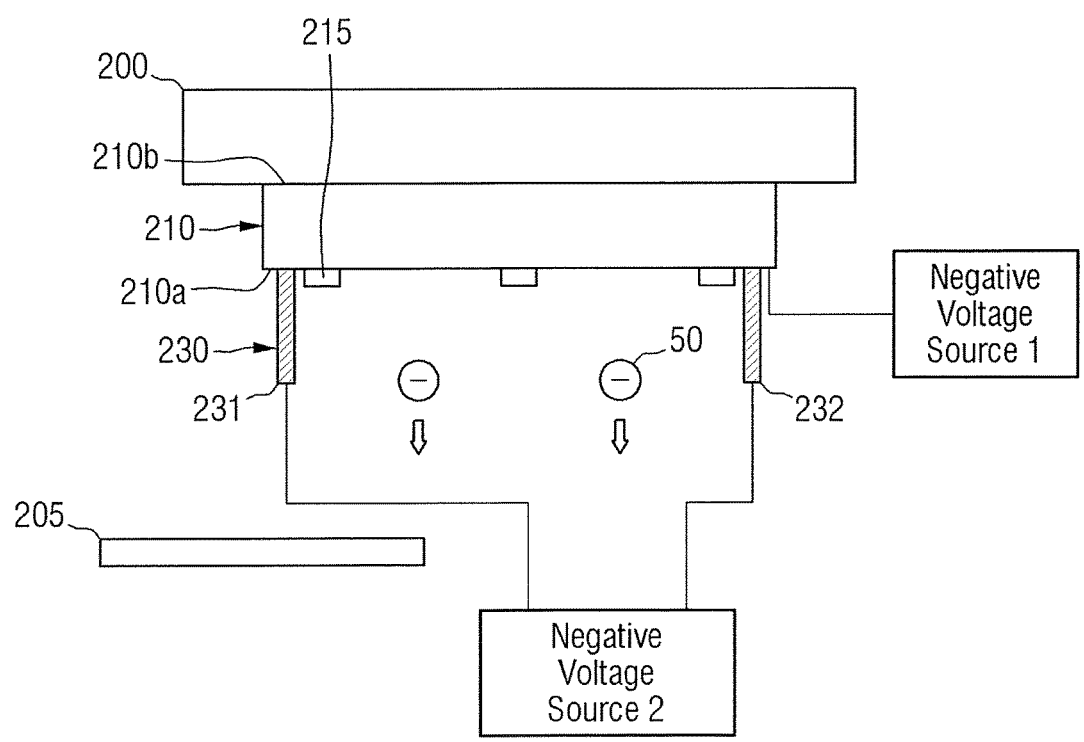
FIG. 6 illustrates a view provided to explain a reticle stage module of a lithography apparatus according to some exemplary embodiments.
Figure 7:
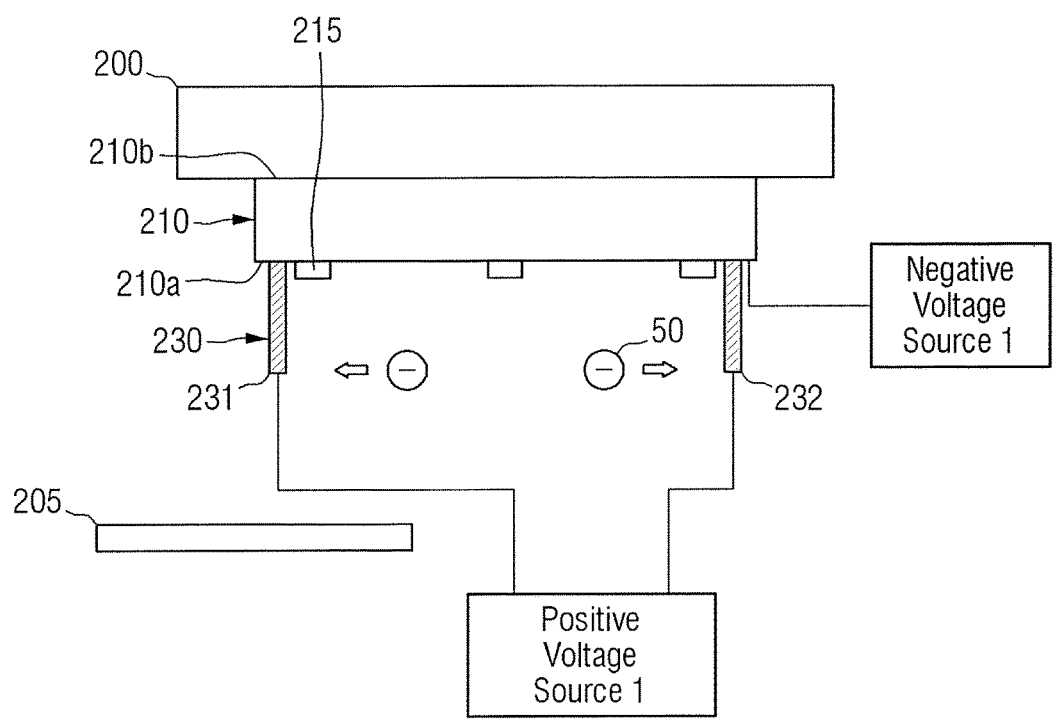
FIG. 7 illustrates a view provided to explain a reticle stage module of a lithography apparatus according to some exemplary embodiments.
Figure 8:
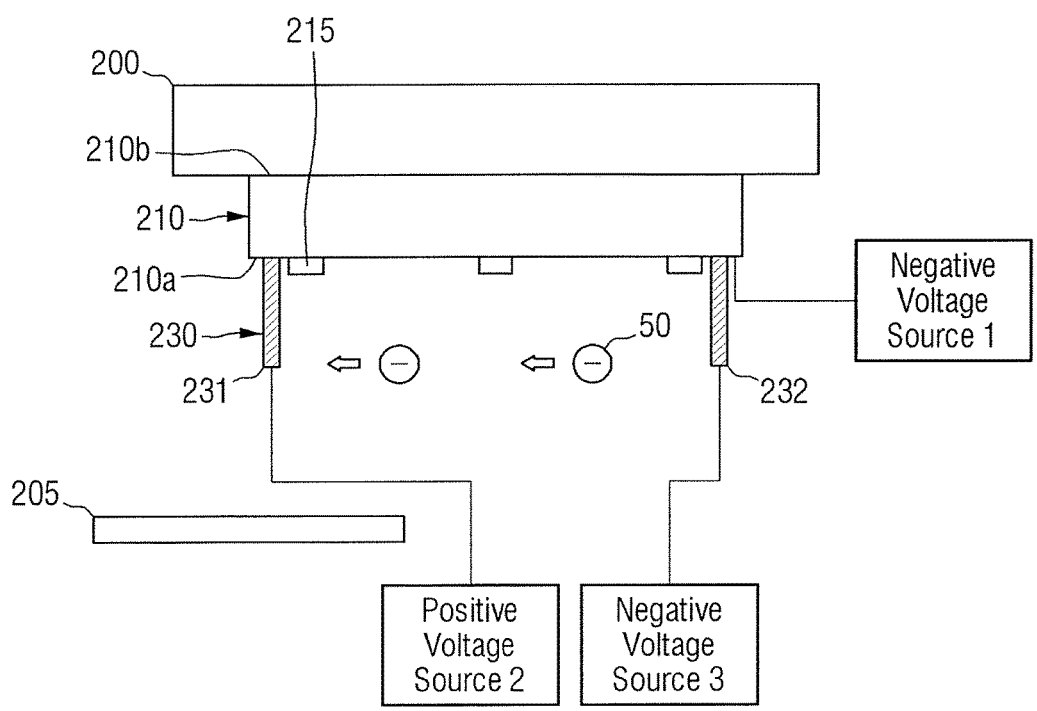
FIG. 8 illustrates a view provided to explain a reticle stage module of a lithography apparatus according to some exemplary embodiments.

FIG. 6 is a view provided to explain a reticle stage module of a lithography apparatus according to some exemplary embodiments. FIG. 7 is a view provided to explain a reticle stage module of a lithography apparatus according to some exemplary embodiments. FIG. 8 is a view provided to explain a reticle stage module of a lithography apparatus according to some exemplary embodiments. For convenience of explanation, differences between FIG. 8 and FIGS. 1 to 4C will be mainly explained below.

Referring to FIGS. 6 and 8, in the lithography apparatus according to some exemplary embodiments, the reticle stage module 130 may further include an electric field curtain 230 connected to the reticle 210.

The electric field curtain 230 may be arranged to adjust a moving direction of the particles 50 on the first surface 210a of the reticle or on a periphery of the reticle 210. For example, the electric field curtain 230 may include at least one or more or more conductors 231, 232 protruding beyond the first surface 210a of the reticle, e.g., may extend from the first surface 210a towards a bottom surface of the chamber 100.

Although FIGS. 6 to 8 illustrate that the electric field curtain 230 includes the first curtain conductor 231 and the second curtain conductor 232, this is only for convenience of explanation, and exemplary embodiments are not limited hereto.

In FIG. 6, the electric field curtain 230 may be connected to a negative voltage source 2. For example, the first curtain conductor 231 and the second curtain conductor 232 may be respectively connected to the negative voltage source 2.

As a negative voltage is applied to the first curtain conductor 231 and the second curtain conductor 232, the electric field curtain 230 may apply the repulsive force to the particles 50 having the negative charges on the first surface 210a of the reticle or on a periphery of the reticle 210. That is, the electric field curtain 230 may allow the particles 50 having negative charges on the first surface 210a of the reticle or on a periphery of the reticle 210 to be moved farther away from the reticle 210. As a result, the particles 50 having negative charges on the first surface 210a of the reticle or on a periphery of the reticle 210 may move farther away from the first surface 210a of the reticle.

The negative voltage source 2 may be the reticle stage power source 300 or another separate voltage source. Further, the negative voltage source 2 may, or may not, be the negative voltage source 1 connected to the first surface 210a of the reticle. When the negative voltage source 2 is the negative voltage source 1, the first curtain conductor 231 and the second curtain conductor 232 may be electrically connected to the first reticle conductive film 211 on the first surface 210a of the reticle. When the negative voltage source 2 is the reticle stage power source 300 or a separate voltage source, the first curtain conductor 231 and the second curtain conductor 232 may be electrically connected to or electrically separated from the first reticle conductive film 211 on the first surface 210a of the reticle.

In FIG. 7, the electric field curtain 230 may be connected to a positive voltage source 1. For example, the first curtain conductor 231 and the second curtain conductor 232 may be respectively connected to the positive voltage source 1.

As a positive voltage is applied to the first curtain conductor 231 and the second curtain conductor 232, the electric field curtain 230 may apply the attraction to the particles 50 having negative charges on the first surface 210a of the reticle or on a periphery of the reticle 210.

Before the particles 50 having negative charges on the first surface 210a of the reticle or on a periphery of the reticle 210 reach or approach the reticle 210, the electric field curtain 230 may attract the particles 50 having negative charges on the first surface 210a of the reticle or on a periphery of the reticle 210.

Before the negatively charged particles 50 reach the first surface 210a of the reticle, the electric field curtain 230 may capture the negatively charged particles 50 on the first surface 210a of the reticle or on a periphery of the reticle 210. As a result, the surface of the reticle 210 may be protected from the particles 50 within the main chamber 100.

The positive voltage source 1 may be the reticle stage power source 300 or a separate voltage source. Because a positive voltage is applied to the electric field curtain 230, the first curtain conductor 231 and the second curtain conductor 232 may be electrically separated from the first reticle conductive film 211 on the first surface 210a of the reticle.

In FIG. 8, the electric field curtain 230 may be connected to a positive voltage source 2 and a negative voltage source 3. For example, the first curtain conductor 231 may be connected to the positive voltage source 2 and the second curtain conductor 232 may be connected to the negative voltage source 3.

As the voltages with different signs are applied to the first curtain conductor 231 and the second curtain conductor 232, the electric field curtain 230 may move the particles 50 having negative charges in a direction from the second curtain conductor 232 to the first curtain conductor 231. That is, as the particles 50 having negative charges move in a parallel direction to the first surface 210a of the reticle with the electric field curtain 230, the surface of the reticle 210 may be protected from the particles 50 within the main chamber 100.

The positive voltage source 2 and the negative voltage source 3 may be the positive terminal and the negative terminal from one voltage source, although exemplary embodiments may not be limited hereto. The positive voltage source 2 and the negative voltage source 3 may be included in the reticle stage power source 300, or in a separate voltage source.

The first curtain conductor 231 applied with a positive voltage may be electrically separated from the first reticle conductive film 211 formed on the first surface 210a of the reticle. However, the second curtain conductor 232 applied with a negative voltage may be electrically connected to, or electrically separated from the first reticle conductive film 211.

Figure 9:
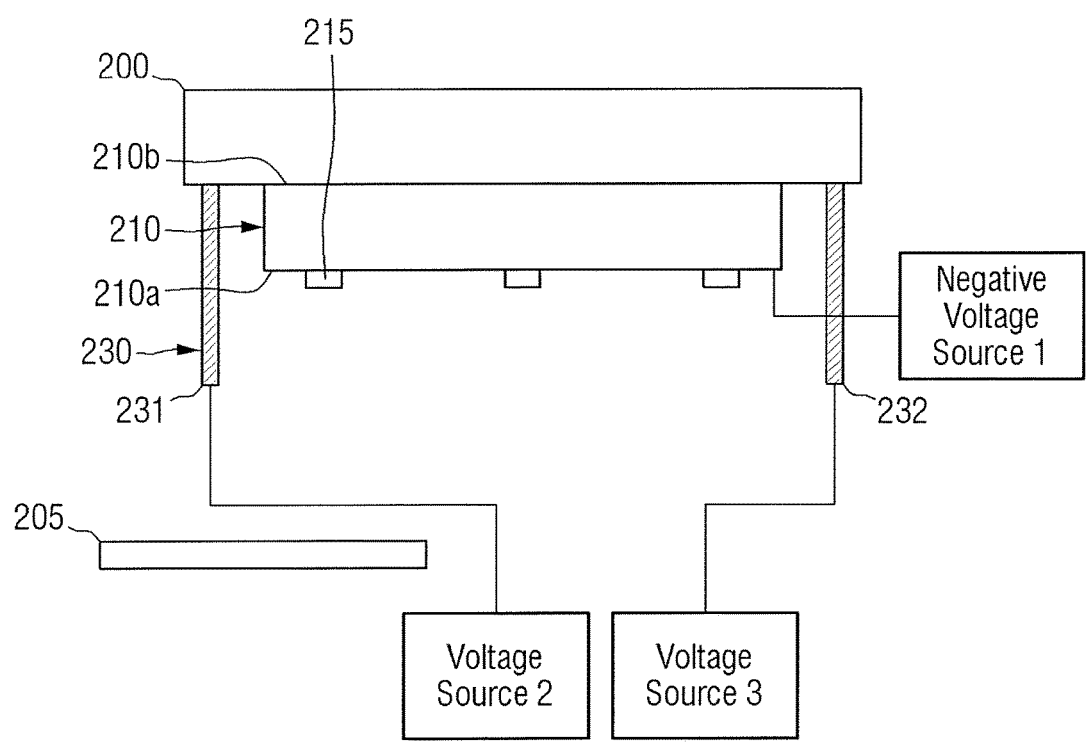
FIG. 9 illustrates a view provided to explain a reticle stage module of a lithography apparatus according to some exemplary embodiments.

FIG. 9 is a view provided to explain a reticle stage module of a lithography apparatus according to some exemplary embodiments. For convenience of explanation, differences between FIG. 9 and FIGS. 1 to 4C will be mainly explained below.

Referring to FIG. 9, in the lithography apparatus according to some exemplary embodiments, the reticle stage module 130 may further include the electric field curtain 230 connected to the reticle stage 200. The electric field curtain 230 may be arranged to adjust a moving direction of the particles 50 on the first surface 210a of the reticle or on a periphery of the reticle 210.

For example, the electric field curtain 230 may include at least one or more conductors 231, 232 protruding further than the first surface 210a of the reticle stage 200, e.g., may extend from an upper surface of the reticle stage 200 past the reticle 210 towards a bottom surface of the main chamber 200. As illustrated in FIG. 9, the electric field curtain 230 may include the first curtain conductor 231 and the second curtain conductor 232, but this is only for convenience of explanation and exemplary embodiments are not limited hereto.

The electric field curtain 230 may be connected to the voltage source 2 and the voltage source 3. For example, the first curtain conductor 231 may be connected to the voltage source 2 and the second curtain conductor 232 may be connected to the voltage source 3.

For example, both the voltage source 2 and the voltage source 3 may be negative voltage sources, as explained above in connection with FIG. 6. For another example, both the voltage source 2 and the voltage source 3 may be positive voltage sources, as explained above in connection with FIG. 7. For yet another example, the voltage source 2 may be a positive voltage source and the voltage source 3 may be a negative voltage source, as explained above in connection with FIG. 8.

Figure 10:
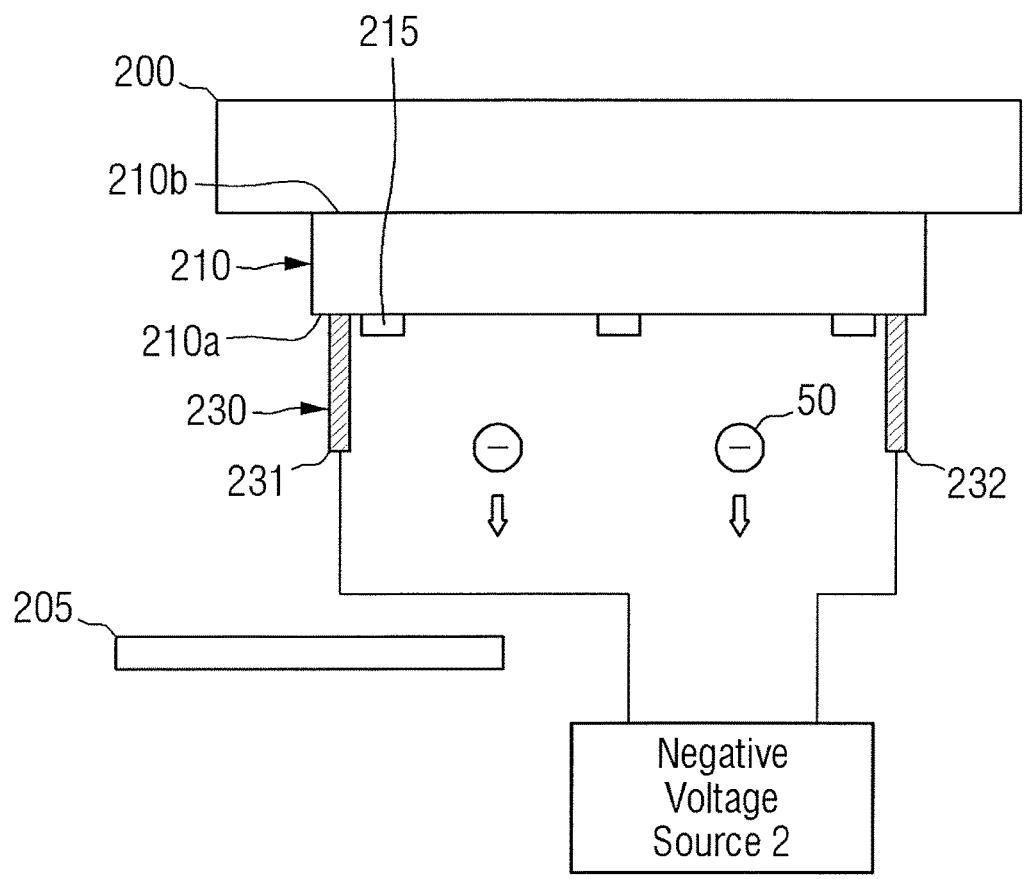
FIG. 10 illustrates a view provided to explain a reticle stage module of a lithography apparatus according to some exemplary embodiments.
Figure 11:
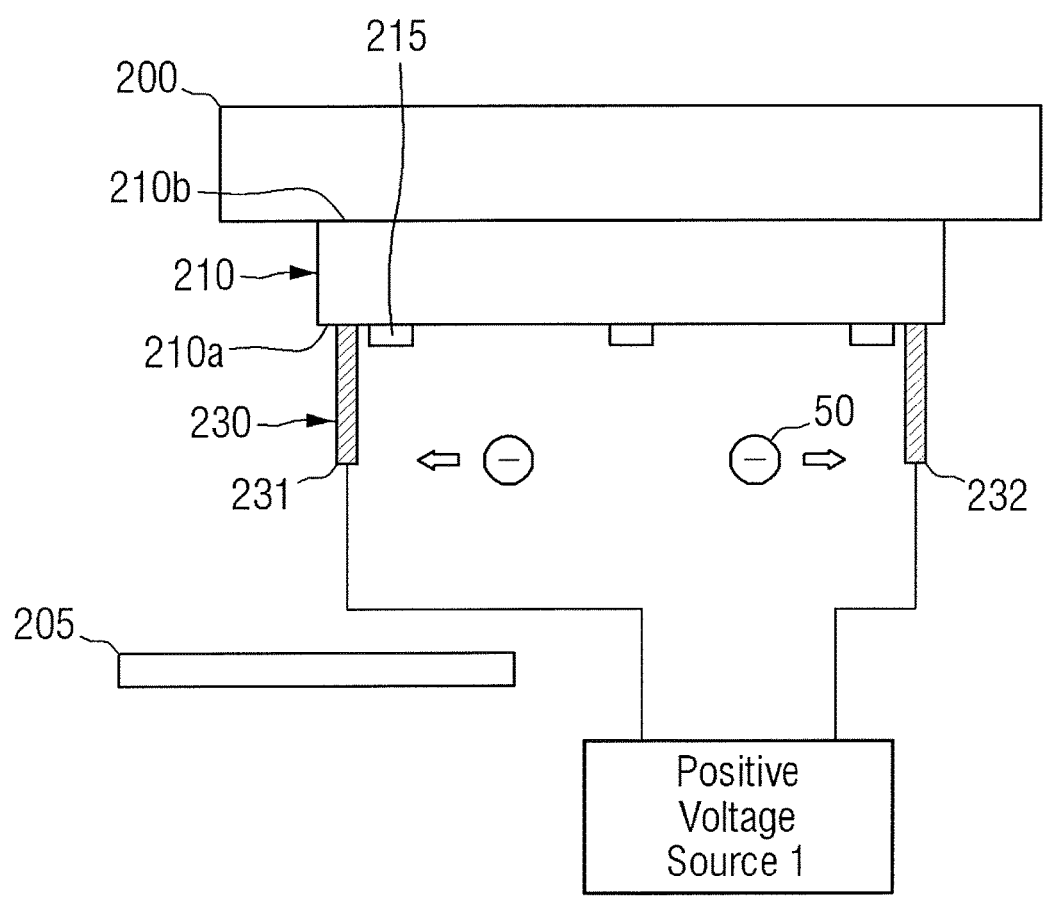
FIG. 11 illustrates a view provided to explain a reticle stage module of a lithography apparatus according to some exemplary embodiments.
Figure 12:
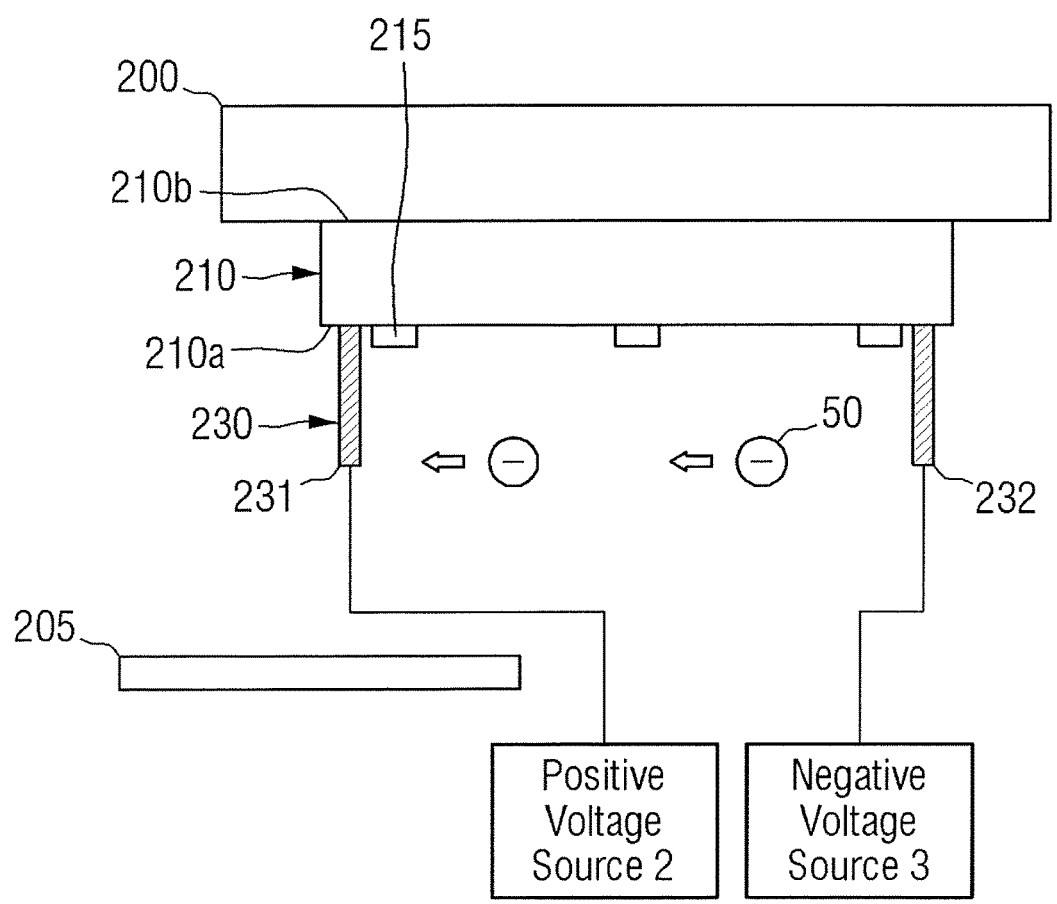
FIG. 12 illustrates a view provided to explain a reticle stage module of a lithography apparatus according to some exemplary embodiments.
Figure 13:
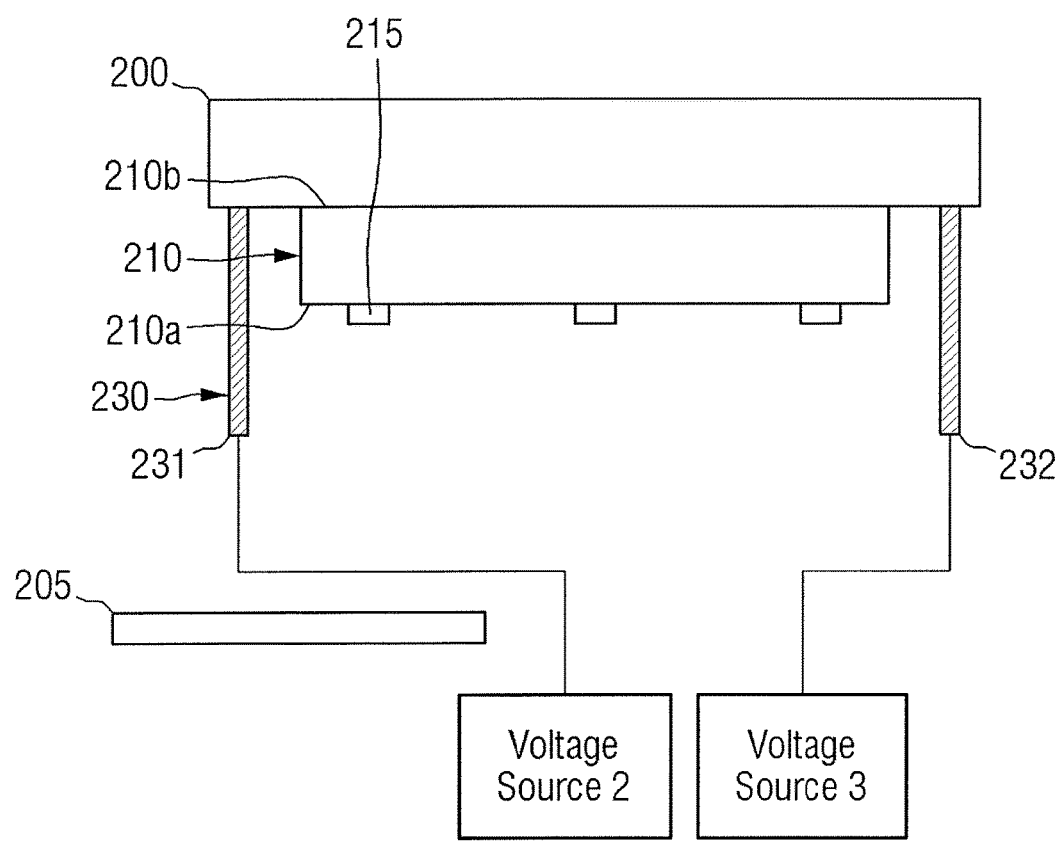
FIG. 13 illustrates a view provided to explain a reticle stage module of a lithography apparatus according to some exemplary embodiments.

FIG. 10 is a view provided to explain a reticle stage module of a lithography apparatus according to some exemplary embodiments. FIG. 11 is a view provided to explain a reticle stage module of a lithography apparatus according to some exemplary embodiments. FIG. 12 is a view provided to explain a reticle stage module of a lithography apparatus according to some exemplary embodiments. FIG. 13 is a view provided to explain a reticle stage module of a lithography apparatus according to some exemplary embodiments. For convenience of explanation, differences between FIGS. 10 to 13 and FIGS. 1 to 4C will be mainly explained below.

Referring to FIGS. 10 to 13, in the lithography apparatus according to some exemplary embodiments, a negative voltage may not be applied to the first surface 210a of the reticle where the pattern region 215 is formed. Further, the reticle stage module 130 may further include the electric field curtain 230, e.g., either on the reticle 210 itself or on the reticle stage 200.

That is, the first reticle conductive film 211 formed on the first surface 210a of the reticle may be not be connected to a voltage source. Accordingly, the first surface 210a of the reticle may be kept in a state in which a voltage is not applied.

In FIGS. 10 to 12, the electric field curtain 230 may be connected to the reticle 210, and may include at least one or more conductors 231, 232 protruding upward higher than the first surface 210a of the reticle.

In FIG. 10, the electric field curtain 230 may be connected to the negative voltage source 2. For example, the first curtain conductor 231 and the second curtain conductor 232 may be respectively connected to the negative voltage source, as explained above in connection with FIG. 6.

In FIG. 11, the electric field curtain 230 may be connected to a positive voltage source 1. For example, the first curtain conductor 231 and the second curtain conductor 232 may be respectively connected to the positive voltage source 1, as explained above in connection with FIG. 7.

In FIG. 12, the electric field curtain 230 may be connected to a positive voltage source 2 and a negative voltage source 3. For example, the first curtain conductor 231 may be connected to the positive voltage source 2 and the second curtain conductor 232 may be connected to the negative voltage source 3, as explained above in connection with FIG. 8.

In FIG. 13, the electric field curtain 230 may be connected to the reticle stage 200. The electric field curtain 230 may include at least one or more conductors 231, 232 protruding beyond the first surface 210a of the reticle, e.g., may extend from an upper surface of the reticle stage 200 past the reticle 210 towards a bottom surface of the main chamber 200.

The electric field curtain 230 may be connected to the voltage source 2 and the voltage source 3. For example, the first curtain conductor 231 may be connected to the voltage source 2 and the second curtain conductor 232 may be connected to the voltage source 3.

For example, both the voltage source 2 and the voltage source 3 may be negative voltage sources, as describe above in connection with FIG. 6. For another example, both the voltage source 2 and the voltage source 3 may be positive voltage sources, as describe above in connection with FIG. 7. For yet another example, the voltage source 2 may be a positive voltage source and the voltage source 3 may be a negative voltage source, as describe above in connection with FIG. 8.

Figure 14:
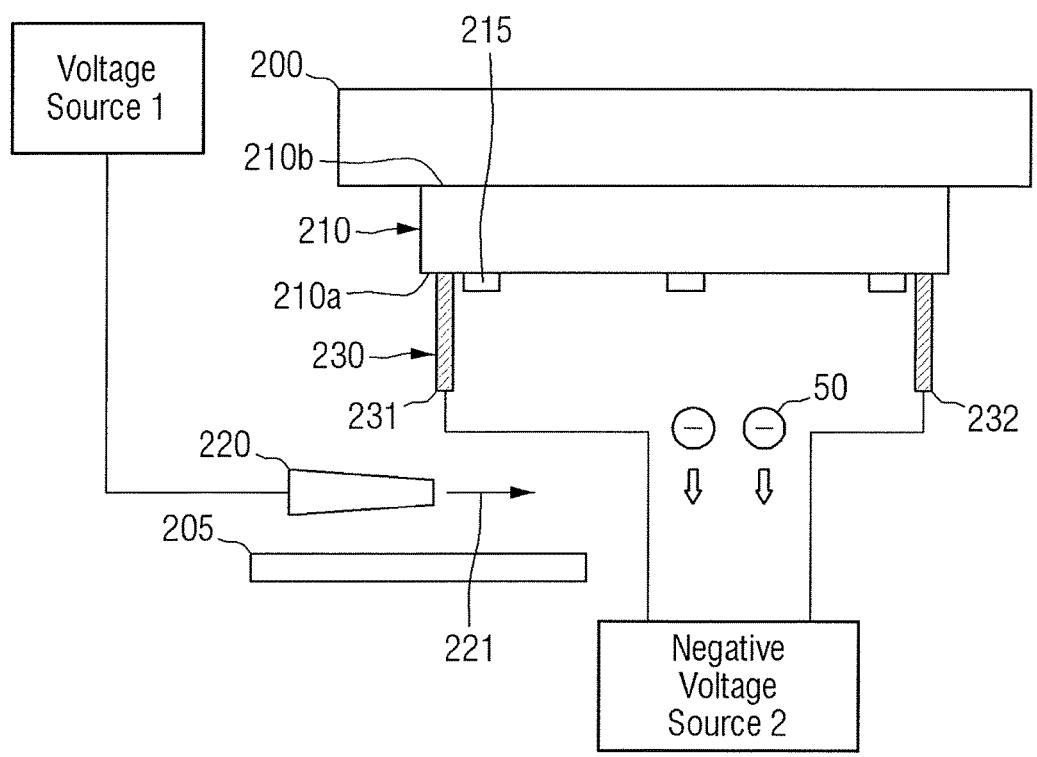
FIG. 14 illustrates a view provided to explain a reticle stage module of a lithography apparatus according to some exemplary embodiments.

FIG. 14 is a view provided to explain a reticle stage module of a lithography apparatus according to some exemplary embodiments. For convenience of explanation, differences between FIG. 14 and FIG. 10 will be mainly explained below.

In the lithography apparatus according to some exemplary embodiments, the reticle stage module 130 may further include the electron supply 220. The electron supply 220 may be arranged to supply the electrons 221 to the particles 50 on the first surface 210a of the reticle or on a periphery of the reticle 210. More specifically, the electron supply 220 may be arranged to provide the electrons 221 to the particles 50 before entering into the electric field curtain 230.

By using the electron supply 220, the electrons 221 may be provided to the particles 50 on the first surface 210a of the reticle or on a periphery of the reticle 210 such that the particles 50 may be negatively charged before entering into the electric field curtain 230. The electric field curtain 23 may adjust a moving direction of the negatively charged particles 50.

FIG. 14 illustrates that the electron supply 220 is between the electric field curtain 230 and the reticle masking blade 205, but this is only for convenience of explanation, and exemplary embodiments are not limited hereto.

Figure 15:
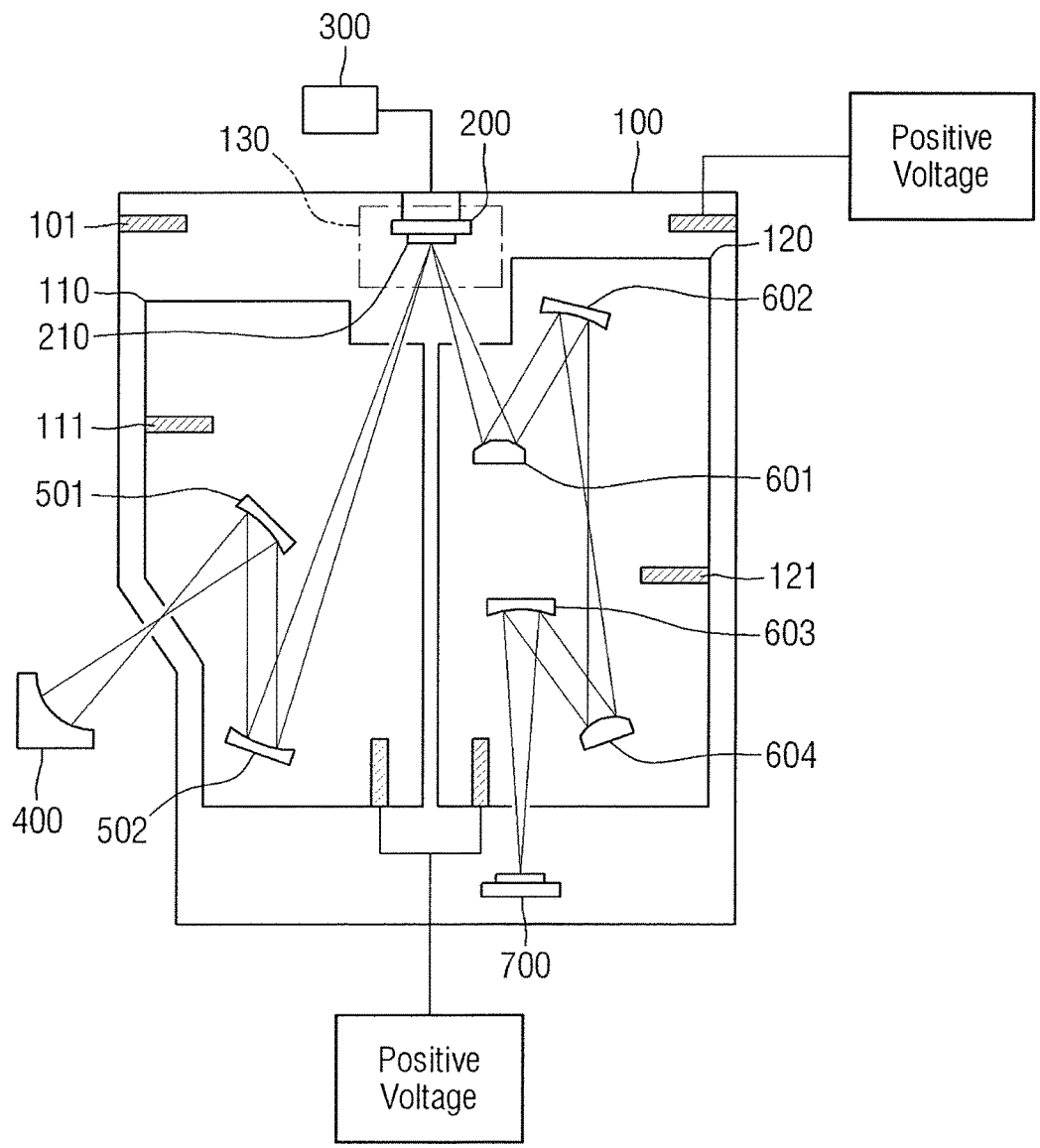
FIG. 15 illustrates a schematic view provided to explain a lithography apparatus according to some exemplary embodiments.

FIG. 15 is a schematic view provided to explain a lithography apparatus according to some exemplary embodiments. For convenience of explanation, differences between FIG. 15 and FIGS. 1 to 4C will be mainly explained below.

Referring to FIG. 15, the lithography apparatus according to some exemplary embodiments may further include a first particle capture electrode 101, a second particle capture electrode 111, and a third particle capture electrode 121.

The main chamber 100 may include the first particle capture electrode 101. The first particle capture electrode 101 may be applied with a positive voltage. The first particle capture electrode 101 may capture the particles having negative charges among the floating particles within the main chamber 100. For example, the first particle capture electrode 101 may include a pair of electrodes facing each other on opposite sides of the reticle stage module 130, e.g., may extend from inner side surfaces of the first chamber 100.

The first sub-chamber 110 may include the second particle capture electrode 111. The second particle capture electrode 111 may be applied with a positive voltage. The second particle capture electrode 111 may capture the particles having negative charges among the floating particles within the first sub-chamber 110. For example, the second particle capture electrode 111 may include a pair of electrodes, e.g., a first electrode extending inwards from an outer sidewall of the first sub-chamber 110, e.g., above a highest reflective mirror 501 therein, and a second electrode extending upwards from a bottom surface of the first sub-chamber 110.

The second sub-chamber 120 may include the third particle capture electrode 121. The third particle capture electrode 121 may be applied with a positive voltage. The third particle capture electrode 121 may capture the particles having negative charges among the floating particles within the second sub-chamber 120. For example, the third particle capture electrode 121 may include a pair of electrodes, e.g., a first electrode extending inwards from an outer sidewall of the second sub-chamber 120, e.g., between reflective mirrors therein and lower than the first electrode of the second particle capture electrode 111, and a second electrode extending upwards from a bottom surface of the second sub-chamber 120.

The first to third particle capture electrodes 101, 111, 121 may prevent the floating particles within the main chamber 100, the first sub-chamber 110, and the second sub-chamber 120 from moving, by capturing the particles within the main chamber 100, the first sub-chamber 110, and the second sub-chamber 120.

Although FIG. 15 illustrates that the first to third particle capture electrodes 101, 111, 121 are respectively formed in the main chamber 100, the first sub-chamber 110, and the second sub-chamber 120, exemplary embodiments may not be limited hereto. That is, in the lithography apparatus according to some exemplary embodiments, at least one of the main chamber 100, the first sub-chamber 110, and the second sub-chamber 120 may include the particle capture electrode applied with a positive voltage therein.

FIG. 15 illustrates that the first to third particle capture electrodes 101, 111, 121 are respectively formed in pairs within the main chamber 100, the first sub-chamber 110, and the second sub-chamber 120, this is only for convenience of explanation, and exemplary embodiments are not limited hereto. Although FIG. 15 illustrates the first to third particle capture electrodes 101, 111, 121 bar-like shapes projecting from a chamber wall, exemplary embodiments may not limited hereto.

Additionally, in the lithography apparatus according to some exemplary embodiments, when at least one of the main chamber 100, the first sub-chamber 110, and the second sub-chamber 120 includes the particle capture electrode within the chamber and the particle capture electrode is applied with a positive voltage, the first surface 210a of FIG. 3 of the reticle may not be applied with a negative voltage. Further, in the lithography apparatus according to some exemplary embodiments, when at least one of the main chamber 100, the first sub-chamber 110, and the second sub-chamber 120 includes the particle capture electrode within the chamber and the particle capture electrode is applied with a positive voltage, the reticle stage module 130 may not include the electron supply 220, the electric field curtain 230, or the like.

Figure 16A:
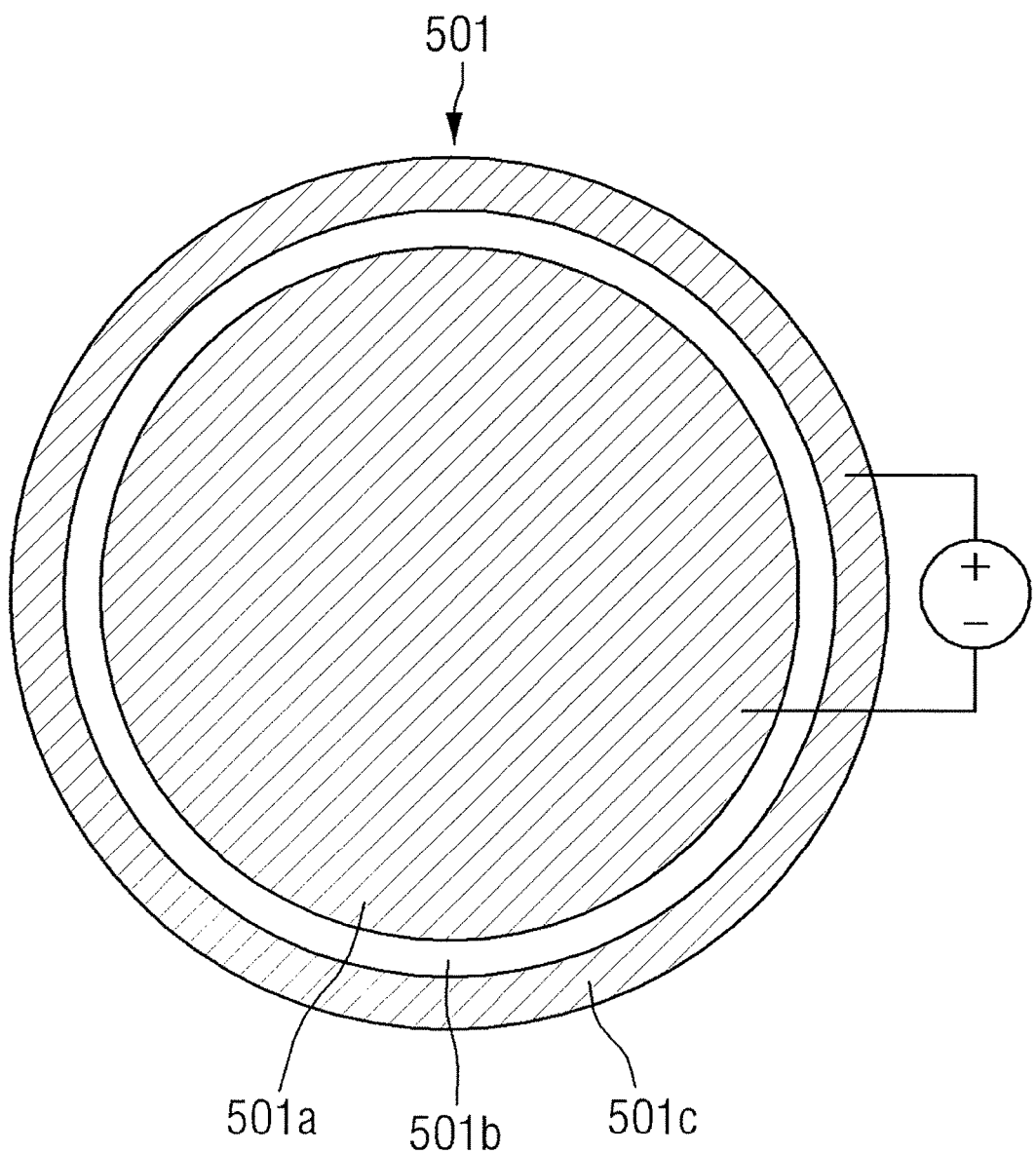

FIGS. 16A and 16B are views provided to explain a shape of a reflective mirror of a lithography apparatus according to some exemplary embodiments. For reference, FIG. 16A exemplifies one of the lighting system reflective mirrors and FIG. 16B exemplifies one of the projection optical system reflective mirrors.

Referring to FIG. 16A, in the lithography apparatus according to some exemplary embodiments, the lighting system reflective mirrors 501 may include a first reflective metal film 501a, a first mirror electrode 501c, and a first mirror insulating film 501b between the first reflective metal film 501a and the first mirror electrode 501c.

The first reflective metal film 501a may reflect the exposure light entering the lighting system reflective mirror 501. The first mirror electrode 501c may be formed around the first reflective metal film 501a, e.g., may surround a periphery of the first reflective metal film 501a. The first mirror electrode 501c may be electrically separated from the first reflective metal film 501a, e.g., the first mirror insulating film 501b may electrically separate the first mirror electrode 501c and the first reflective metal film 501a.

The first mirror electrode 501c and the first reflective metal film 501a may be connected to voltages of different polarities from each other. That is, when the first reflective metal film 501a is connected to a positive voltage, the first mirror electrode 501c may be connected to a negative voltage. Of course, the above may be implemented reversely.

Because the lighting system reflective mirror 501 is a consumable product, a portion of the first reflective metal film 501a of the lighting system reflective mirror 501 may be scraped off during operation of the lithography apparatus. When the scraped metal film is present on the first reflective metal film 501a of the lighting system reflective mirror 501, distortion may occur in the reflecting exposure light. However, when the first mirror electrode 501c and the first reflective metal film 501a are connected to voltages of different polarities from each other, a portion of the scraped first reflective metal film 501a may move to a direction of the first mirror electrode 501c. As a result, distortion occurring in the reflecting exposure light may be alleviated.

Referring to FIG. 16B, in the lithography apparatus according to some exemplary embodiments, the projection optical system reflective mirror 601 may include a second reflective metal film 601a, a second mirror electrode 601c, and a second mirror insulating film 601b between the second reflective metal film 601a and the second mirror electrode 601c.

The second reflective metal film 601a may reflect the exposure light entering the projection optical system reflective mirror 601. The second mirror electrode 601c may be formed around the second reflective metal film 601a, e.g., the first mirror insulating film 601b may electrically separate the first mirror electrode 601c and the first reflective metal film 601a. The second mirror electrode 601c may be electrically separated from the second reflective metal film 601a, e.g., the second mirror insulating film 601b may electrically separate the second mirror electrode 601c and the second reflective metal film 601a.

The second mirror electrode 601c and the second reflective metal film 601a may be connected to voltages of different polarities. That is, when the second reflective metal film 601a is connected to a positive voltage, the second mirror electrode 601c may be connected to a negative voltage. Of course, the above may be implemented reversely.

Because the projection optical system reflective mirror 601 is a consumable product, a portion of the second reflective metal film 601a of the projection optical system reflective mirror 601 may be scraped off during operation of the lithography apparatus. When the scraped metal film is present on the projection optical system reflective mirror 601, the reflecting exposure light may have occurrence of distortion. However, when the second mirror electrode 601c and the second reflective metal film 601a are connected to voltages of different polarities, a portion of the scraped second reflective metal film 601a may move to a direction of the second mirror electrode 601c.

The lighting optical system reflective mirrors 501, 502 and the projection optical system reflective mirrors 601, 602, 603, 604 included in the lithography apparatus described with reference to FIGS. 1 to 15 may or may not have the shapes described in FIGS. 16A and 16B.

When in shapes other than the shapes described in FIGS. 16A and 16B, the lighting optical system reflective mirrors 501, 502 and the projection optical system reflective mirrors 601, 602, 603, 604 included in the lithography apparatus described with reference to FIGS. 1 to 15 may not include the first mirror electrode 501c and the second mirror electrode 601c. That is, the voltage source may not be connected to the lighting optical system reflective mirrors 501, 502 and the projection optical system reflective mirrors 601, 602, 603, 604.

Further, the lighting optical system reflective mirrors 501, 502 and the projection optical system reflective mirrors 601, 602, 603, 604 may not include the first mirror insulating film 501b and the second mirror insulating film 601b.

Figure 17:
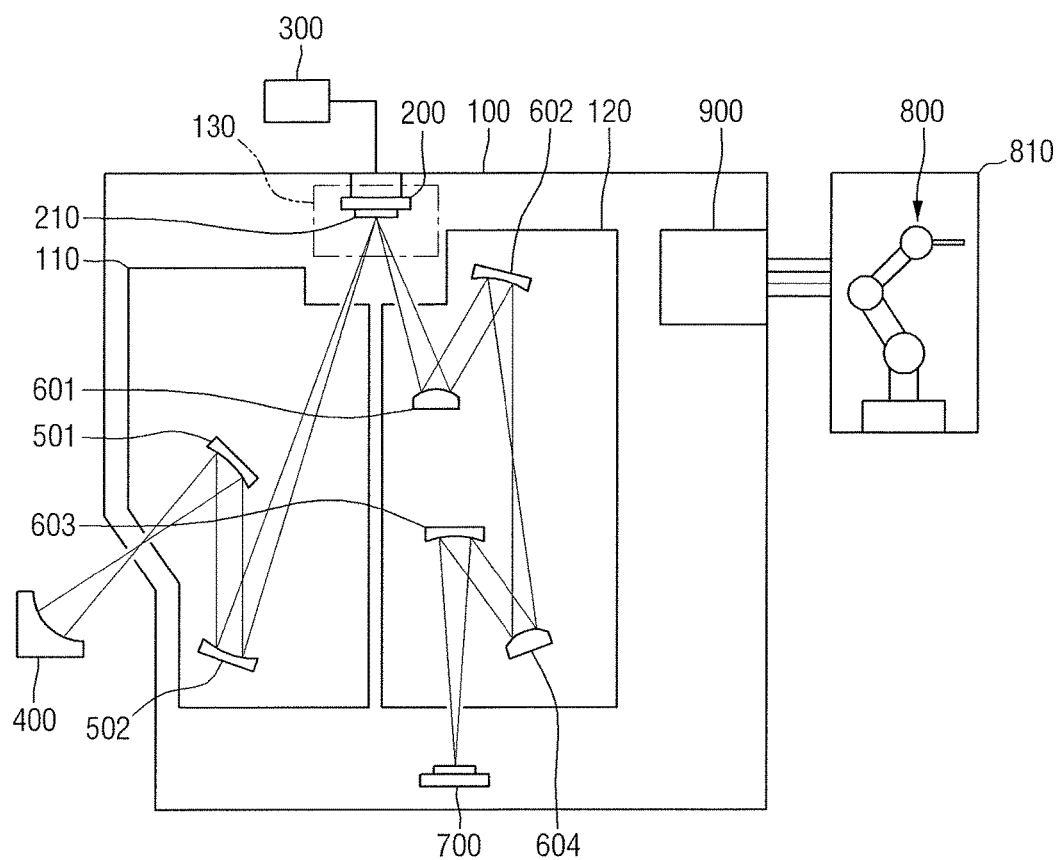
FIG. 17 illustrates a view provided to explain a lithography method according to some exemplary embodiments.

FIG. 17 is a view provided to explain a lithography method according to some exemplary embodiments. Referring to FIG. 17, the reticle 210 may be moved by a reticle handler 800, past a robot chamber 900, and to the reticle stage 200. The reticle 210 may be chucked to the reticle stage 200. The reticle handler chamber 810 and the robot chamber 900 may be kept in a vacuum state.

When the reticle 210 is chucked to the reticle stage 200, a negative voltage may be applied to the first surface 210a of the reticle. Further, after the reticle 210 is chucked to the reticle stage 200, a negative voltage may be applied to the first surface 210a of the reticle.

The source 400 may emit the exposure light to the reflective mirror 501 within the first sub-chamber 110. The source 400 may be, for example, a DPP EUV light source, a LPP EUV light source, a hybrid EUV light source, a synchrotron EUV light source, and so on.

The exposure light may be reflected against a plurality of lighting system reflective mirrors 501, 502 within the first sub-chamber 110 to arrive at the surface of the reticle 210, i.e., at the first surface 210a of the reticle. The exposure light reflected against the surface of the reticle 210 may reflected against a plurality of projection optical system reflective mirrors 601, 602, 603, 604 within the second sub-chamber 120 to be emitted to the wafer.

By way of summation and review, one or more embodiments may provide a lithography apparatus and method which can protect a surface of a reticle from particle pollution by using electric force. For example, a protection conductor may be provided, e.g., in the reticle stage module and/or in the chamber, to protect the reticle from particle pollution. For example, when the protection conductor covers a surface of the reticle having the pattern region thereon, a negative voltage may be applied thereto to repel the particles. When the protection conductor is in the reticle stage module, but not covering the surface of the reticle having the pattern region thereon, a negative voltage or a positive voltage may be applied thereto to repel or attract the particles. When the protection conductor is in the chamber outside the reticle stage module, a positive voltage may be applied thereto to attract the particles. An electric field curtain may be provided to insure all particles are negatively charged to further enhance the attraction or repulsion.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A lithography apparatus, comprising:
a reticle having a first surface and a second surface opposite each other, and a pattern region formed on the first surface;
a reticle stage facing the second surface of the reticle, the reticle stage to chuck the reticle;
a first power source to provide a negative voltage to the first surface of the reticle so as to prevent adsorption of particles onto the reticle;
a conductor in physical contact with the reticle and to which a voltage is provided; and
a second power source to provide the voltage to the conductor.

2. The lithography apparatus as claimed in claim 1, further comprising an electron supply to provide electrons to the particles on the first surface of the reticle or on a periphery of the reticle.

3. The lithography apparatus as claimed in claim 1, wherein the conductor forms an electric field curtain to adjust a moving direction of the particles on the first surface of the reticle or on a periphery of the reticle.

4. The lithography apparatus as claimed in claim 3, wherein:
a negative voltage is applied to the conductor, and
the electric field curtain causes the particles to be moved farther away from the reticle by applying repulsive force to the particles.

5. The lithography apparatus as claimed in claim 3, wherein:
a positive voltage is applied to the conductor, and
the electric field curtain captures the particles by applying attraction to the particles before the particles reach the reticle.

6. The lithography apparatus as claimed in claim 3, wherein:
the electric field curtain includes a first conductor, wherein a negative voltage is applied to the first conductor, and a second conductor, wherein a positive voltage is applied to the second conductor, and
the electric field curtain moves the particles in a direction from the first conductor to the second conductor.

7. The lithography apparatus as claimed in claim 1, wherein the reticle is chucked to the reticle stage with electrostatic force.

8. The lithography apparatus as claimed in claim 1, wherein the conductor extends from the first surface away from the reticle stage.

9. A lithography apparatus, comprising:
a reticle having a first surface and a second surface opposite each other along a first direction, and a pattern region formed on the first surface;
a reticle stage facing the second surface of the reticle, the reticle stage to chuck the reticle;
an electric field curtain arranged to adjust a moving direction of particles, the electric field curtain being on the first surface of the reticle or on a periphery of the reticle, and including at least one or more conductors, the electric field curtain extending past the pattern region along the first direction; and
a first power source to provide a negative voltage to the first surface of the reticle so as to prevent adsorption of particles onto the reticle; and
a second power source to provide a voltage to the at least one or more conductors.

10. The lithography apparatus as claimed in claim 9, further comprising an electron supply to provide electrons to the particles on the first surface of the reticle or on the periphery of the reticle.

11. The lithography apparatus as claimed in claim 9, wherein a negative voltage is applied to the first surface of the reticle.

12. The lithography apparatus as claimed in claim 9, wherein:
a negative voltage is applied to the one or more conductors, and
the electric field curtain causes the particles to be moved farther away from the reticle by applying repulsive force to the particles.

13. The lithography apparatus as claimed in claim 9, wherein:
a positive voltage is applied to the one or more conductors, and
the electric field curtain captures the particles by applying attraction to the particles before the particles reach the reticle.

14. The lithography apparatus as claimed in claim 9, wherein:
the electric field curtain includes a first conductor to be provided with a negative voltage and a second conductor to be provided with a positive voltage, and
the electric field curtain moves the particles in a direction from the first conductor to the second conductor.

15. A lithography apparatus, comprising:
a source to provide an exposure light;
a first sub-chamber including at least one or more lighting system reflective mirrors disposed therein to reflect the exposure light;
a reticle stage module including a reticle reflecting the exposure light output from the first sub-chamber;
a second sub-chamber including at least one or more projection optical system reflective mirrors therein to project the exposure light reflected from the reticle onto a wafer;
a conductor in physical contact with the reticle;
a wafer stage to which the wafer is to be chucked;
a first power source to provide a negative voltage to the first surface of the reticle so as to prevent adsorption of particles onto the reticle; and
a second power source to provide a voltage to the conductor,
wherein the reticle includes a first surface on which the exposure light is incident, and a pattern region on the first surface.

16. The lithography apparatus as claimed in claim 15, wherein the reticle stage module further includes an electron supply to provide electrons to the particles on the first surface of the reticle or on a periphery of the reticle.

17. The lithography apparatus as claimed in claim 15, wherein the conductor forms an electric field curtain to adjust a moving direction of the particles on the first surface of the reticle or on a periphery of the reticle.

18. The lithography apparatus as claimed in claim 15, wherein the second sub-chamber further includes a particle capture electrode within the second sub-chamber, a positive voltage being applied to the particle capture electrode.

19. The lithography apparatus as claimed in claim 15, wherein the exposure light is extreme ultraviolet (EUV) light.

\* \* \* \* \*